(12) United States Patent
Yang et al.

(10) Patent No.: US 7,493,766 B2
(45) Date of Patent: Feb. 24, 2009

(54) AUXILIARY ELECTRICAL POWER GENERATION

(75) Inventors: Jihui Yang, Lakeshore (CA); Michael F. Matouka, Shelby Township, MI (US); Francis R. Stabler, Troy, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 367 days.

(21) Appl. No.: 11/226,062

(22) Filed: Sep. 14, 2005

(65) Prior Publication Data

US 2006/0066106 A1 Mar. 30, 2006

Related U.S. Application Data

(60) Provisional application No. 60/614,920, filed on Sep. 30, 2004.

(51) Int. Cl.
F02C 1/00 (2006.01)
F02G 3/00 (2006.01)
F02M 57/06 (2006.01)
F02N 11/06 (2006.01)

(52) U.S. Cl. ............................ 60/722; 60/776; 123/297; 123/200; 290/41

(58) Field of Classification Search ............... 290/52, 290/1 A, 41; 60/722, 596, 643, 776; 136/205, 136/209, 200; 123/297, 200
See application file for complete search history.

(56) References Cited

U.S. PATENT DOCUMENTS

| 2,841,372 | A | * | 7/1958 | Phillips | 261/41.5 |
| 4,567,857 | A | * | 2/1986 | Houseman et al. | 123/3 |
| 4,625,509 | A | * | 12/1986 | Sheppard, Sr. | 60/39.35 |
| 4,942,863 | A | * | 7/1990 | Chou et al. | 126/110 E |
| 5,332,959 | A | * | 7/1994 | Malmquist et al. | 322/14 |
| 5,550,410 | A | * | 8/1996 | Titus | 290/52 |
| 6,244,034 | B1 | * | 6/2001 | Taylor et al. | 60/776 |
| 6,392,313 | B1 | * | 5/2002 | Epstein et al. | 290/52 |
| 6,987,329 | B1 | * | 1/2006 | Smith et al. | 290/2 |
| 2004/0261831 | A1 | * | 12/2004 | Tsuneoka et al. | 136/205 |
| 2005/0139248 | A1 | * | 6/2005 | Strnad | 136/205 |
| 2005/0207953 | A1 | * | 9/2005 | Upadhye et al. | 422/240 |
| 2008/0006040 | A1 | * | 1/2008 | Peterson et al. | 62/116 |

OTHER PUBLICATIONS

J. Vican et al., Development of a Microreactor as a Thermal Source for Microelectromechanical Systems power Generation, Proceedings of the Combustion Institute, vol. 29, 2002, pp. 909-916.

* cited by examiner

Primary Examiner—J. Gonzalez

(57) ABSTRACT

An auxiliary electrical power supply includes a fuel combustor passively sourced with fuel for combusting fuel and a thermoelectric generator close-coupled to the combustor for converting the heat from the combustor to electric power.

24 Claims, 2 Drawing Sheets

AUXILIARY ELECTRICAL POWER GENERATION

TECHNICAL FIELD

This application claims priority from U.S. Provisional Application No. 60/614,920 filed Sep. 30, 2004, entitled AUTOMOTIVE AUXILIARY POWER UNIT AND CONTROL.

TECHNICAL FIELD

The present invention is related to vehicle electrical systems. More particularly, the invention is concerned with an auxiliary source of thermoelectric power.

BACKGROUND OF THE INVENTION

Vehicles are employing increasingly greater numbers of functional options. Telematics, entertainment, information, navigation, collision avoidance, vehicle stability, emission control, steer by-wire, and electronic braking are but a few examples. Consequently, the use of electronic vehicle control modules has proliferated. This is a trend which promises to continue. Vehicle control modules may continue to actively operate systems even after the vehicle has been shut down and is inactive (key-off). For example, various lighting controls may remain active to enable various courtesy lighting features. Certain telematics and keyless entry systems are required to be active for receiving signals, for example to allow for remotely unlocking the vehicle. Also, certain emission diagnostic systems may remain active to perform various functional tests which can only be performed accurately after a period of vehicle inactivity. Apart from such key-off functions, all control modules have an associated current draw for maintaining associated volatile memory devices. Moreover, control modules and other vehicle electrical components may have associated leakage currents that are nothing more than parasitic draws on the battery. If unchecked, such draws will eventually result in depletion of the vehicle battery below an acceptable state of charge. The time to depletion is becoming less and less as the various key-off loads become greater.

It is known to monitor current draw from a vehicle battery or battery state of charge during key-off periods. Such monitoring is performed with the further objective of shedding loads so as to prevent depletion of the vehicle battery to a point where the vehicle can no longer be started therewith. Of course, this will render inoperative related vehicle systems, including telematics and keyless entry systems.

Often it is desirable to operate certain vehicle systems or to power external accessories when a vehicle is inactive, for example, operating the vehicle radio or entertainment system, or running small appliances or televisions. However, vehicle batteries will quickly become depleted from such activities. Auxiliary power units have been proposed for providing on-board electrical power in vehicles. Such auxiliary power units may be in addition to or in displacement of traditional belt-driven alternators. It has been proposed that such auxiliary power units would enable operation of all typical vehicle loads—and even some very substantial non-traditional electrical loads such as electrically-powered air-conditioning compressors—during periods of engine-off idle. Such auxiliary power units would need to be scaled to provide significant amounts of electrical energy, and would present cost and packaging challenges.

SUMMARY OF THE INVENTION

The present invention provides an on-vehicle auxiliary power unit for generating supplemental electrical power. The auxiliary power unit is adaptable for low-power, key-off operation to provide sufficient electrical power for parasitic and key-off vehicle electric loads and to provide a key-off charging source for the vehicle battery. The auxiliary power unit of the present invention includes a thermoelectric generator, which receives thermal energy from a fuel combustor. The fuel combustor receives fuel from the vehicle's bulk fuel tank which also supplies the vehicle internal combustion engine. The auxiliary power unit may include a voltage regulator. Preferably, fuel is passively delivered to the combustor, for example via a gravity feed system or through capillary action. Preferably, the combustor operates through flameless combustion, for example by way of a catalytic combustion process.

An auxiliary electrical power generator includes a source of fuel, a fuel combustor, a thermoelectric generator close-coupled to the fuel combustor for conversion of heat from fuel combustion into electrical power and a fuel delivery system effective to passively provide the fuel to the fuel combustor for combustion therein. In an automotive environment, the source of fuel may include a vehicular fuel tank. The fuel combustor may include a catalytic combustor. The fuel combustor may include a microcombustor which may be of the catalytic combustion type. The fuel combustor may include an ignition source. In accordance with the invention, passive provision of fuel to the fuel combustor may include capillary fuel delivery gravity feed fuel delivery or pressurized fuel delivery, for example.

An auxiliary vehicular electrical power generator includes a vehicular fuel delivery system including a fuel tank for storing liquid fuel and a fuel pump for providing pressurized fuel to an internal combustion engine when the engine is running. Further, the auxiliary vehicular electrical power generator includes a fuel combustor, a thermoelectric generator close-coupled to the fuel combustor for conversion of heat from fuel combustion into electrical power and a combustor fuel delivery system effective to passively provide the liquid fuel to the fuel combustor for combustion therein. The auxiliary vehicular electrical power generator may include a voltage regulator electrically coupled to the thermoelectric generator. The combustor fuel delivery system may include combustor fuel storage apparatus for storing pressurized liquid fuel provided by the fuel pump when the engine is running, and fuel release apparatus for controllably releasing pressurized liquid fuel from the combustor fuel storage apparatus to the fuel combustor. The combustor fuel storage apparatus may include a control valve, a fuel accumulator and a check valve. The fuel release apparatus may include a control valve. The combustor fuel delivery system may include a reserve fuel tank, a capillary fuel delivery apparatus, or gravity feed fuel delivery apparatus. The fuel combustor may include a microcombustor which may be of the catalytic combustion type. The fuel combustor may include an ignition source. The thermoelectric generator may use a portion of the vehicle as a heat sink. Furthermore, the vehicle may include a battery and the electrical power from the thermoelectric generator may be used to charge the battery. The electrical power from the thermoelectric generator may be used to power safety critical vehicle systems, for example subsequent to a collision or loss of primary vehicle electrical power. The electrical power from the thermoelectric generator may be used to power vehicle accessory systems when the engine is not running.

An auxiliary vehicular electrical power generator includes a vehicular fuel delivery system including a bulk fuel tank for storing liquid fuel and a fuel pump for providing pressurized fuel to an internal combustion engine when the engine is running. Further, the auxiliary vehicular electrical power generator includes a vehicular electrical system including a battery, a fuel combustor, a thermoelectric generator close-coupled to the fuel combustor for conversion of heat from fuel combustion into electrical power, a combustor fuel delivery system including a combustor fuel storage apparatus for providing the liquid fuel to the fuel combustor for combustion therein, and a controller adapted to control the combustor fuel delivery system to provide the liquid fuel to the fuel combustor. The combustor fuel delivery system may include fuel release apparatus responsive to the controller for controllably releasing fuel from the combustor fuel storage apparatus to the fuel combustor and may include a control valve. The combustor fuel storage apparatus may store pressurized liquid fuel provided by the fuel pump and may include a control valve, a fuel accumulator and a check valve. The controller may be adapted to control the fuel pump. The combustor fuel storage apparatus may include a reserve fuel tank or the bulk fuel tank. The combustor fuel delivery system may include capillary fuel delivery apparatus or gravity feed fuel delivery apparatus. The controller may be adapted to monitor battery state of charge and control the combustor fuel delivery system to provide the liquid fuel to the fuel combustor based on the battery state of charge. The auxiliary vehicular electrical power generator may further include a voltage regulator electrically coupled to the thermoelectric generator. The controller may be adapted to control the voltage regulator.

DESCRIPTION OF THE PREFERRED EMBODIMENT

Figure 1:
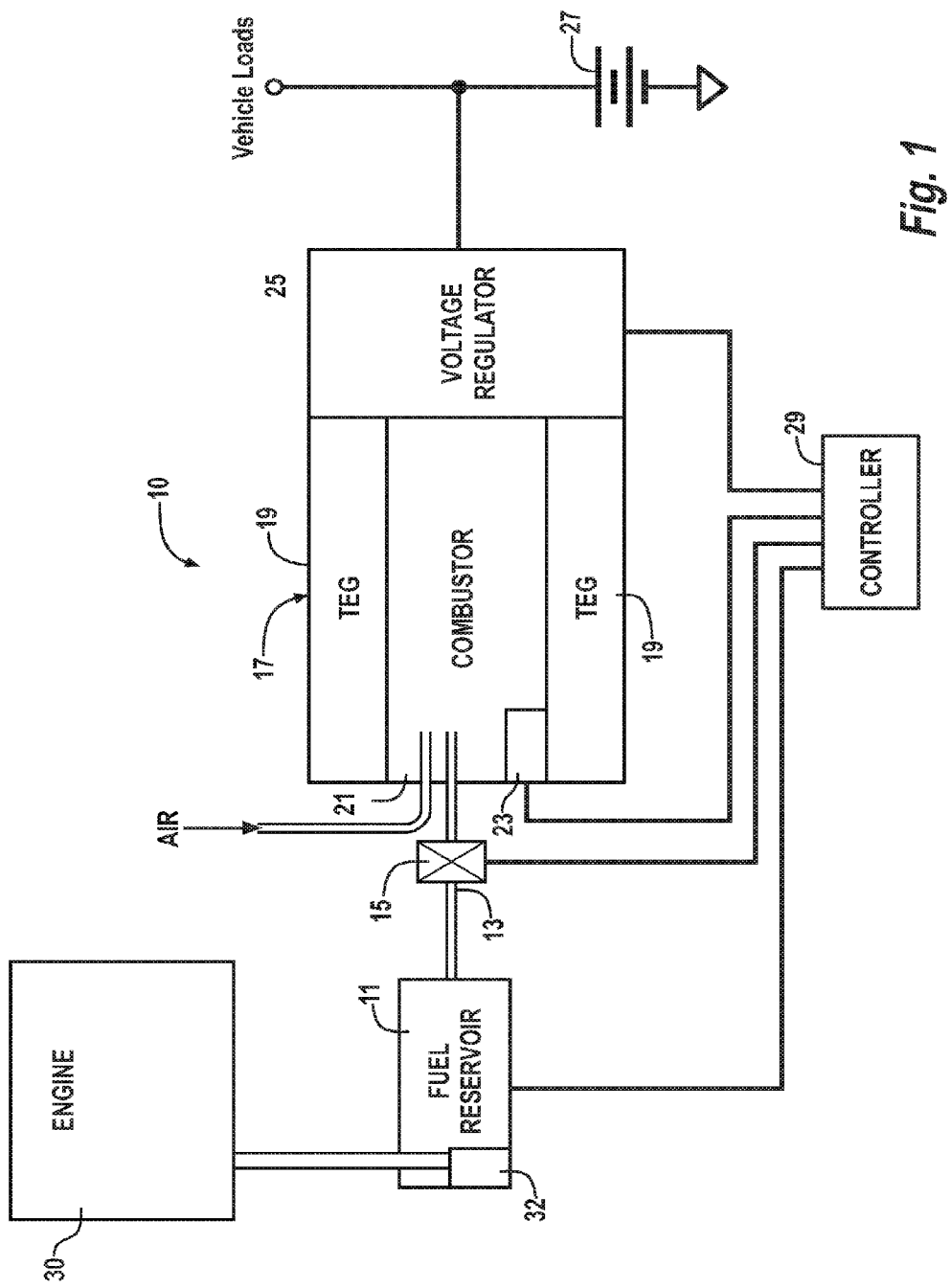
FIG. 1 is a schematic illustration of a vehicular auxiliary power unit in accordance with the present invention.

Referring first to FIG. 1, an internal combustion engine vehicle (not shown) includes an auxiliary power system 10 having an electric power generator 17 comprising fuel combustor 21 and close-coupled thermoelectric generator (TEG) 19.

TEG 19 utilizes the Seebeck effect. The fuel combustor 21 heats the hot side of TEG 19, and the cold side of TEG 19 is cooled by the unit's case, a heat sink, or the vehicle chassis. In the presence of a temperature gradient across the electrically connected n- and p-type materials within the TEG 19, a voltage produced by the Seebeck effect will cause current to flow through the load, generating electrical power.

TEG 19 takes the general form of any suitable material exhibiting relatively large Seebeck coefficients for the combustion temperatures produced by the combustor. Also important to the selection of TEG material are the electrical and thermal conductivities. All of these considerations are accounted for in the dimensionless thermoelectric figure of merit (ZT) which can be expressed as follows:

$$ZT = T \cdot S^2 \left[ \frac{\sigma}{k} \right] \quad (1)$$

where
T is the temperature of interest, Kelvin,
S is the material's Seebeck coefficient,
$\sigma$ is the material's electrical conductivity, and
k is the material's thermal conductivity.

From the above, it is appreciated that a good thermoelectric material will have a large Seebeck coefficient to produce the required voltage, high electrical conductivity to minimize joule heating ($I^2R$ losses), and low thermal conductivity to decrease thermal losses. TEG 19 is close coupled to fuel combustor 21 for efficient thermal transfer to one side of the TEG 19. The other side of the TEG may be open-air cooled, fin cooled, thermally coupled to the vehicle body as a heat sink, etc.

Figure 2:
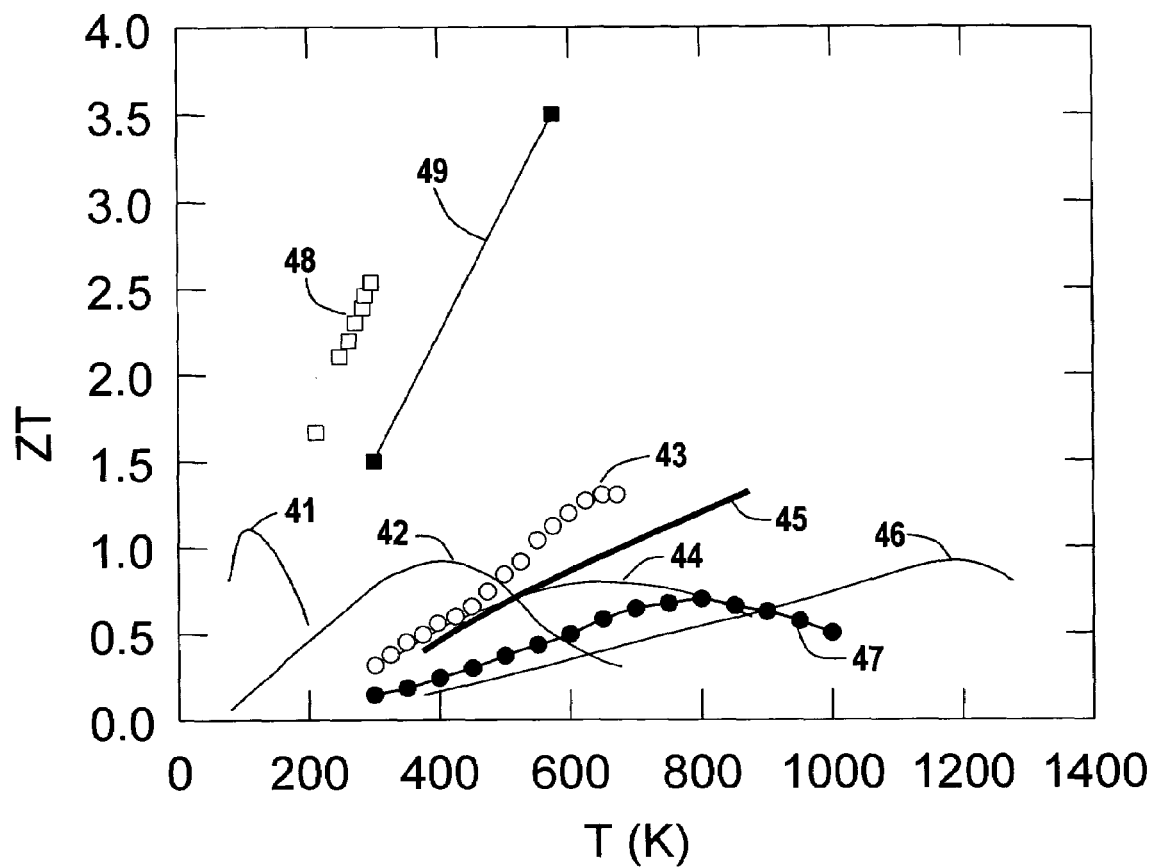
FIG. 2 is a chart showing various thermoelectric generating material figures of merit (ZT) versus temperature useful in selecting thermoelectric generator material for the present invention.

In FIG. 2, a variety of TEG material alternatives are illustrated including superlattice thin-film $Bi_2Te_3/Sb_2Te_3$ (48), $Zn_4Sb_3$-based semiconductors (43), Ce-filled skutterudites $Ce_yCo_xFe_{4-x}Sb_{12}$ (45), BiSb (Bi=0.2T) (41), $Bi_2Te_3$ (42), PbTe-based materials (44), ZrNiSn-based alloys (47), SiGe (46) and $PbSe_xTe_{1-x}$/PbTe quantum dots (49). However, higher ZT materials in the temperature range of interest are preferred. For example, $PbSe_xTe_{1-x}$/PbTe quantum dots (49), $Zn_4Sb_3$-based semiconductors (43), Ce-filled skutterudites $Ce_yCo_xFe_{4-x}Sb_{12}$ (45) and PbTe-based materials (44) would result in higher overall chemical fuel to electricity conversion efficiency.

Fuel combustor 21 may be any suitable combustion means for combusting the fuel from the vehicle fuel reservoir 11. Fuel combustor also receives combustion air. Preferably, fuel combustor 21 employs flameless combustion, such as by catalytic combustion means. It is generally believed that catalytic combustion temperatures are better suited for TEG materials and produce lesser NOx emissions than flame-based combustors. For example, well-known catalytic screen or grid combustors comprising platinum or palladium satisfactorily provide for flameless combustion of a wide variety of hydrocarbon-based fuels including, as non-limiting examples, common gasoline blends, diesel fuels, propane, natural gas, kerosene, naphtha, etc. Fuel combustor 21 may further include ignition source 23 and, depending upon the type of combustion process employed, may take the form of a spark ignition source, flame ignition source or glow plug type ignition source.

In one preferred implementation suitable for low power requirements, combustor 21 comprises a microcombustor and preferably a catalytic microcombustor. Microcombustors are preferred in smaller scale applications wherein the power requirements are relatively small.

Figure 3:
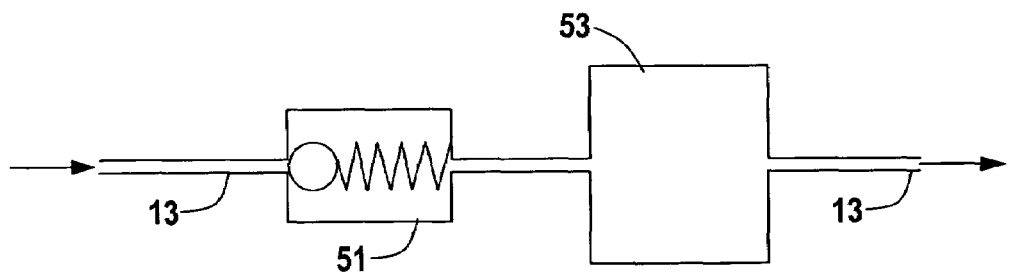
FIG. 3 is a schematic illustration of a check valve and fuel accumulator in accordance with the present invention.

Fuel reservoir 11 is preferably a main or bulk fuel tank of the vehicle adapted for delivery of fuel to the fuel combustor 21 for combustion thereby. Alternatively, the fuel reservoir may be a reserve tank, integrated or remote from the main fuel tank. In non- vehicular applications, fuel reservoir may include a fuel storage tank including gaseous or fluid fuel storage tanks or direct utility service coupling such as to commercial or residential natural gas lines. The fuel reservoir is shown coupled to the fuel combustor via fuel line 13 and controllable valve 15. Valve 15 may, for example, be a solenoid-controlled valve, including a flow control orifice to open, close, and regulate the flow of fuel to fuel combustor 21. Fuel reservoir 11, fuel line 13 and combustor 21 are preferably cooperatively located such that liquid fuels are passively delivered to the fuel combustor such as by gravity feed or capillary action. Alternatively, a vehicle fuel pump 32 (located internally or near fuel reservoir 11), which provides pressurized fuel to an internal combustion engine 30 during vehicle operation may be employed to provide pressurized fuel to fuel line 13 for delivery to fuel combustor 21. And, as illustrated in FIG. 3, a check valve 51 and accumulator 53 may be added to the fuel line downstream of pressurized fuel and upstream of controllable valve 15 to store pressurized fuel during vehicle operation, maintain pressurized fuel when the fuel pump is off and passively deliver the pressurized fuel from the accumulator to the combustor as needed during key-off operation. This approach will avoid the extra power needed to continuously operate the fuel pump to source pressurized fuel. If the storage capacity of the accumulator is exceeded during any key-off period, then the fuel pump may be temporarily run as required to replenish the pressurized supply in accumulator 53.

Voltage regulator 25 may be desirable in accordance with the characteristics of the vehicle electrical system and the TEG. In the exemplary embodiment, the vehicle electrical system is assumed to be a conventional 12 volt electrical system including battery 27. Other vehicular electrical system architectures are equally applicable including other higher voltage electrical systems and dual-voltage electrical systems. The objectives of any voltage regulator are to ensure appropriate interfacing and protection of the vehicle electrical system and the TEG. For example, if TEG has a characteristically lower output voltage than the nominal vehicle electrical system, the voltage regulator 25 may function as a DC to DC converter for proper interfacing of the TEG to the electrical system such that the voltage is sufficient to charge the battery 27 and power the vehicle apparatus. Alternatively, where the TEG has a characteristically higher and more closely matched output voltage relative to the nominal vehicle electrical system, a direct connection arrangement through a diode may provide adequate functionality, wherein the diode would prevent the battery sending current back into the TEG 19. If the TEG has a characteristically higher output voltage than the nominal vehicle electrical system but a relatively high internal impedance, the relatively low internal impedance of the battery 27 would not require regulation per se, though a reverse blocking diode might be desirable. In this latter scenario, if the battery were disconnected from the electrical system, some type of voltage regulation might then be desirable for the interface between the TEG and the remaining vehicle electrical system components. In all cases, the TEG's output voltage or power would be controlled (albeit slowly) primarily by controlling the flow of the fuel into the combustor 21.

Auxiliary power system 10 also includes a control module 29 for implementing various control functions related to the auxiliary power system 10. The control module 10 is adapted to obtain inputs, directly sensed or provided thereto such as by a controller area network (CAN) bus interface with CAN sensors or other control modules, and include TEG output voltage or current and vehicle system voltage. Fuel level in the primary fuel reservoir 11 is monitored via conventional means, to ensure that the fuel level is not reduced below a minimum programmable level. Fuel level or pressure in reservoir 53 may also be sensed for proper operation of the combustor 21. Control module 29 is adapted to effect control at least of controllable valve 15, and additionally as the case may be to effect control of the ignition source 23, voltage regulator 25, and fuel pump.

In operation, when auxiliary power is required, the control module opens controllable valve 15 and initiates combustion of the fuel delivered to the combustion chamber 21. This heats the TEG 19, which converts the heat into electrical power. The electrical power is provided to charge the vehicle battery 27, supplement the power provided by the vehicle battery 27 or substitute for the power otherwise provided by the vehicle battery 27. In one utilization, battery state of charge is determined, for example through periodic control module wake-up routines during key-off mode to measure battery voltage and reference a look-up table data relating open-circuit battery voltage to battery state of charge. If battery state of charge falls below a predetermined threshold, the power generator 17 is activated to restore the state of charge to an acceptable level. In another utilization, the power generator 17 is activated subsequent to loss of primary vehicle electrical power (e.g. battery or alternator) to provide an auxiliary source of electrical power for the operation of hazard flashers, telematics collision notification systems or other safety critical systems. Loss of primary vehicle electrical power may be due to system faults, collision damage or other effects, for example. In yet another example of auxiliary power unit utilization and control, the power generator 17 is activated to provide power when the engine is off for accessories and external loads such as entertainment, information, cell phone charging, mobile office equipment, trailer loads, etc.

Conversion efficiency from chemical fuel to electricity is approximately 1.5% with the combustor temperature between 175 degrees C. and 300 degrees C. and $Bi_2Te_3$-based TEG material. However, overall conversion efficiencies of substantially 2% are achievable using the preferred materials. The energy density of gasoline is substantially 8.76 kWh/l. Therefore, the estimated electricity generated by one gallon of gasoline is approximately 663 Wh, or 47 Ah for a 14 V system. The estimated electricity generated by one gallon of gasoline would be sufficient to support a 20 mA key-off load for 98 days.

The invention has been described with respect to certain exemplary embodiments. However, it is to be understood that there can be various modifications and alternative implementations of the invention without departing from the scope of the invention as defined in the following claims.

The invention claimed is:

1. Auxiliary vehicular electrical power generator comprising:
    a vehicular fuel delivery system including a fuel tank for storing liquid fuel and a fuel pump for providing pressurized fuel to an internal combustion engine when the engine is running;
    a fuel combustor;
    a thermoelectric generator close-coupled to said fuel combustor for conversion of heat from fuel combustion into electrical power; and
    a combustor fuel delivery system effective to passively provide the liquid fuel to the fuel combustor for combustion therein, the combustion fuel delivery system comprising a combustor fuel storage apparatus for storing pressurized liquid fuel provided by the fuel pump when the engine is running and a fuel release apparatus for controllably releasing pressurized liquid fuel from the combustor fuel storage apparatus to the fuel combustor, wherein the combustor fuel storage apparatus comprises: a control valve; a fuel accumulator; and, a check valve.

2. The auxiliary vehicular electrical power generator as claimed in claim 1 wherein the fuel combustor comprises a microcombustor.

3. The auxiliary vehicular electrical power generator as claimed in claim 2 wherein the microcombustor comprises a catalytic microcombustor.

4. The auxiliary vehicular electrical power generator as claimed in claim 1 wherein the fuel combustor comprises a catalytic combustor.

5. The auxiliary vehicular electrical power generator as claimed in claim 1 wherein the fuel combustor comprises an ignition source.

6. The auxiliary vehicular electrical power generator as claimed in claim 1 wherein passive provision of fuel to the fuel combustor comprises capillary fuel delivery.

7. The auxiliary vehicular electrical power generator as claimed in claim 1 wherein passive provision of fuel to the fuel combustor comprises gravity feed fuel delivery.

8. The auxiliary vehicular electrical power generator as claimed in claim 1 wherein passive provision of fuel to the fuel combustor comprises pressurized fuel delivery.

9. The auxiliary vehicular electrical power generator as claimed in claim 1 wherein the thermoelectric generator uses a portion of the vehicle as a heat sink.

10. The auxiliary vehicular electrical power generator as claimed in claim 1 wherein the vehicle includes a battery and the electrical power from the thermoelectric generator is used to charge the battery.

11. The auxiliary vehicular electrical power generator as claimed in claim 1 wherein the electrical power from the thermoelectric generator is used to power safety critical vehicle systems.

12. Auxiliary vehicular electrical power generator comprising:
a vehicular fuel delivery system including a fuel tank for storing liquid fuel and a fuel pump for providing pressurized fuel to an internal combustion engine when the engine is running;
a fuel combustor;
a thermoelectric generator close-coupled to said fuel combustor for conversion of heat from fuel combustion into electrical power; and
a combustor fuel delivery system effective to passively provide the liquid fuel to the fuel combustor for combustion therein
wherein the electrical power from the thermoelectric generator is used to power safety critical vehicle systems and the electrical power from the thermoelectric generator is used to power safety critical vehicle systems subsequent to a collision.

13. The auxiliary vehicular electrical power generator as claimed in claim 12 wherein the electrical power from the thermoelectric generator is used to power safety critical vehicle systems subsequent to loss of primary vehicle electrical power.

14. The auxiliary vehicular electrical power generator as claimed in claim 12 wherein the electrical power from the thermoelectric generator is used to power vehicle accessory systems when the engine is not running.

15. The auxiliary vehicular electrical power generator as claimed in claim 12 further comprising a voltage regulator electrically coupled to the thermoelectric generator.

16. Auxiliary vehicular electrical power generator comprising: a vehicular fuel delivery system including a bulk fuel tank for storing liquid fuel and a fuel pump for providing pressurized fuel to an internal combustion engine when the engine is running; a vehicular electrical system including a battery; a fuel combustor; a thermoelectric generator close-coupled to said fuel combustor for conversion of heat from fuel combustion into electrical power; a combustor fuel delivery system including a combustor fuel storage apparatus for providing the liquid fuel to the fuel combustor for combustion therein; and a controller adapted to control the combustor fuel delivery system to provide the liquid fuel to the fuel combustor wherein the combustor fuel storage apparatus stores pressurized liquid fuel provided by the fuel pump and wherein the combustor fuel storage apparatus comprises: a control valve; a fuel accumulator; and, a check valve.

17. The auxiliary vehicular electrical power generator as claimed in claim 16 wherein the combustor fuel storage apparatus comprises a reserve fuel tank.

18. The auxiliary vehicular electrical power generator as claimed in claim 16 wherein the combustor fuel storage apparatus comprises the bulk fuel tank.

19. The auxiliary vehicular electrical power generator as claimed in claim 16 wherein the combustor fuel delivery system comprises capillary fuel delivery apparatus.

20. The auxiliary vehicular electrical power generator as claimed in claim 16 wherein the combustor fuel delivery system comprises gravity feed fuel delivery apparatus.

21. Auxiliary vehicular electrical power generator comprising: a vehicular fuel delivery system including a bulk fuel tank for storing liquid fuel and a fuel pump for providing pressurized fuel to an internal combustion engine when the engine is running; a vehicular electrical system including a battery; a fuel combustor; a thermoelectric generator close-coupled to said fuel combustor for conversion of heat from fuel combustion into electrical power; a combustor fuel delivery system including a combustor fuel storage apparatus for providing the liquid fuel to the fuel combustor for combustion therein; and a controller adapted to control the combustor fuel delivery system to provide the liquid fuel to the fuel combustor wherein the controller is adapted to monitor battery state of charge and control the combustor fuel delivery system to provide the liquid fuel to the fuel combustor based on the battery state of charge.

22. The auxiliary vehicular electrical power generator as claimed in claim 21 further comprising a voltage regulator electrically coupled to the thermoelectric generator.

23. The auxiliary vehicular electrical power generator as claimed in claim 22 wherein the controller is adapted to control the voltage regulator.

24. The auxiliary vehicular electrical power generator as claimed in claim 21 wherein the controller is adapted to control the fuel pump.

* * * * *